(12) United States Patent
Jeong et al.

(10) Patent No.: US 12,180,578 B2
(45) Date of Patent: Dec. 31, 2024

(54) RF SPUTTERING APPARATUS FOR CONTROLLING ATOMIC LAYER OF THIN FILM

(71) Applicant: PUSAN NATIONAL UNIVERSITY INDUSTRY—UNIVERSITY COOPERATION FOUNDATION, Busan (KR)

(72) Inventors: Se Young Jeong, Busan (KR); You Sil Lee, Busan (KR); Su Jae Kim, Busan (KR); Sang Eon Park, Busan (KR); Mi Yeon Cheon, Busan (KR)

(73) Assignee: PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 0 days.

(21) Appl. No.: 18/031,071

(22) PCT Filed: Aug. 31, 2021

(86) PCT No.: PCT/KR2021/011650
§ 371 (c)(1),
(2) Date: Apr. 10, 2023

(87) PCT Pub. No.: WO2022/080658
PCT Pub. Date: Apr. 21, 2022

(65) Prior Publication Data
US 2023/0374652 A1    Nov. 23, 2023

(30) Foreign Application Priority Data

Oct. 14, 2020  (KR) .......................... 10-2020-0132905

(51) Int. Cl.
*H01J 37/32*         (2006.01)
*C23C 14/34*         (2006.01)

(52) U.S. Cl.
CPC .... *C23C 14/3414* (2013.01); *H01J 37/32082* (2013.01); *H01J 37/32798* (2013.01)

(58) Field of Classification Search
None
See application file for complete search history.

(56) References Cited

U.S. PATENT DOCUMENTS

| | | | | |
|---|---|---|---|---|
| 3,814,356 A | * | 6/1974 | Coleman | H01J 37/02 248/638 |
| 2004/0206117 A1 | * | 10/2004 | Chen | C03B 11/086 65/374.13 |

(Continued)

FOREIGN PATENT DOCUMENTS

| | | |
|---|---|---|
| JP | 2017-193993 A | 10/2017 |
| KR | 10-2000-0038224 A | 7/2000 |

(Continued)

OTHER PUBLICATIONS

International Search Report for PCT/KR2021/011650 mailed Jan. 14, 2022 from Korean Intellectual Property Office.

*Primary Examiner* — Jason Berman
(74) *Attorney, Agent, or Firm* — Paratus Law Group, PLLC

(57) ABSTRACT

There is provided an RF sputtering apparatus for controlling an atomic layer of a thin film. The RF sputtering apparatus includes: a sputtering main body including a substrate, a target facing the substrate, and a chamber for performing a sputtering process to deposit the target on the substrate; a power supply unit connected to the target of the sputtering main body via a network to apply RF power; a roughing pump unit for forming vacuum inside the chamber of the sputtering main body; and a gas supply unit for supplying reaction gas to the inside of the chamber. A power cable for (Continued)

supplying a power source to the power supply unit is formed with a single crystal copper wire.

5 Claims, 3 Drawing Sheets

(56) References Cited

U.S. PATENT DOCUMENTS

| | | | | |
|---|---|---|---|---|
| 2005/0205809 A1* | 9/2005 | Uchida | ......... | B82Y 10/00 |
| | | | | 250/442.11 |
| 2007/0169857 A1* | 7/2007 | Jeong | ......... | C30B 15/36 |
| | | | | 148/562 |
| 2017/0369986 A1* | 12/2017 | Jeong | ......... | C30B 23/025 |
| 2020/0105499 A1* | 4/2020 | Kawaguchi | ......... | H01J 37/023 |

FOREIGN PATENT DOCUMENTS

| KR | 20-0352083 Y1 | 6/2004 |
|---|---|---|
| KR | 10-2005-0096893 A | 10/2005 |
| KR | 10-2009-0108887 A | 10/2009 |

\* cited by examiner

FIG. 3

| No. | Additionally modified configuration | SEM / XRD | AFM / EBSD | Characteristics |
|---|---|---|---|---|
| 1 | Conventional RF sputtering | | | RMS: ~45.1nm |
| 2 | Replace the target with a single crystal metal | | | RMS: ~10nm |
| 3 | 2 + Replace the outdoor grounding part with a single crystal copper + Form the power cable and the network with a single crystal copper wire | | | RMS: 0.2~0.5nm Reproducibility: 85% |
| 4 | 3 + Support the sputtering main body with the vibration blocking unit | | | RMS: 0.2~0.4nm Reproducibility: 90% |
| 5 | 4 + Physically separate the vacuum part + Support the vacuum part with the vibration blocking unit | | | RMS: ~0.3nm Reproducibility: 98% |

RF SPUTTERING APPARATUS FOR CONTROLLING ATOMIC LAYER OF THIN FILM

CROSS-REFERENCE TO PRIOR APPLICATIONS

This application is a National Stage Patent Application of PCT International Patent Application No. PCT/KR2021/011650 (filed on Aug. 31, 2021) under 35 U.S.C. § 371, which claims priority to Korean Patent Application No. 10-2020-0132905 (filed on Oct. 14, 2020), which are all hereby incorporated by reference in their entirety.

BACKGROUND

The present invention relates to an RF sputtering apparatus for controlling an atomic layer of a thin film, and more specifically, in a case in which a metal thin film is manufactured by an RF sputtering apparatus, to an RF sputtering apparatus which comprises a power cable and a power line as a single crystal copper wire to remove electrical noise, and supports an RF sputtering main body and a rotary pump as a vibration blocking unit to block physical vibration, thereby controlling particles coming apart from a target in atomic layer units to epitaxially grow a metal thin film.

A method of forming a thin film on a substrate is sorted into a chemical method of synthesizing solid materials of a thin film through a chemical reaction from gaseous raw materials, and a physical method of depositing particles to be deposited on a substrate by a physical method. The chemical method includes chemical vapor deposition, plating, and the like, and the physical method sputtering, spin coating, and the like.

The sputtering deposition is to manufacture a metal thin film by applying radio frequency (RF) power to a target material, which is a deposition material in a vacuum state, to separate the target material into particles and depositing the particles on the surface of a substrate located at the opposite side.

Such an RF sputtering deposition method is economical compared to other thin film deposition techniques, and is widely used in various application fields. However, the RF sputtering deposition method has limitations in manufacturing a high-quality thin film since electrical noise or physical vibration is applied during the deposition of particles to the substrate from the target.

In order to manufacture a high-quality metal thin film epitaxially grown by a single crystal having a predetermined directionality, or to manufacture a metal thin film whose surface roughness is controlled at a nanometer level, it is necessary to remove electrical noise or physical vibration so that the particles are uniformly deposited on the substrate.

SUMMARY

Accordingly, the present invention has been made in view of the above-mentioned problems occurring in the related art, and it is an object of the present invention to provide an RF sputtering apparatus capable of manufacturing a high-quality metal thin film by forming a power cable and a network with a single crystal copper wire to remove electrical noise when RF power is applied to a target material.

It is another object of the present invention to provide an RF sputtering apparatus capable of manufacturing a high-quality metal thin film by using a target metal as a single crystal metal to separate homogeneous particles from a target by sputtering.

It is a further object of the present invention to provide an RF sputtering apparatus capable of manufacturing a high-quality metal thin film by separating a sputtering main body and a roughing pump and supporting both of the sputtering main body and the roughing pump with a vibration blocking unit to remove physical vibration from a sputtering chamber.

The foregoing technical objects of the present invention are not limited to those mentioned above, and other technical objects not mentioned herein will be clearly understood by those skilled in the art from the following description.

To accomplish the above-mentioned objects, according to the present invention, there is provided an RF sputtering apparatus for controlling an atomic layer of a thin film, capable of manufacturing a high-quality metal thin film by removing electrical noise or physical vibration during a sputtering process.

Hereinafter, the present invention will be described in more detail.

The present invention provides an RF sputtering apparatus for controlling an atomic layer of a thin film, including: a sputtering main body including a substrate, a target facing the substrate, and a chamber for performing a sputtering process to deposit the target on the substrate; a power supply unit connected to the target of the sputtering main body via a network to apply RF power; a roughing pump unit for forming vacuum inside the chamber of the sputtering main body; and a gas supply unit for supplying reaction gas to the inside of the chamber, wherein a power cable for supplying a power source to the power supply unit is formed with a single crystal copper wire.

In the present invention, the target of the sputtering main body is formed into a single crystal target by cutting a single crystal metal of a cylindrical shape grown by the Czochralski method or the Bridgman method.

In the present invention, the network for transferring the RF power of the power supply unit to the sputtering main body is formed with a single crystal copper wire.

In the present invention, the outdoor grounding part grounded on the power supply unit is formed with a single crystal copper bulk obtained by cutting the cylindrical single crystal copper grown by the Czochralski method or the Bridgman method.

In the present invention, each edge of the bottom surface of the sputtering main body is supported by the vibration blocking unit to prevent vibration from the floor being transferred thereto, and the vibration blocking unit includes: a spike attached to the bottom surface of the sputtering main body to support the sputtering main body, and having a horned shape which is gradually sharper toward the floor; and a shoe seated on the floor and having an insertion groove formed on the upper surface for accommodating the peak of the spike to fix only the planar position of the spike.

In the present invention, the roughing pump unit is physically separated from the sputtering main body, and is connected to the chamber via a connection hose made of a rubber material, and the center of the connection hose is fixed on the wall surface connected to the floor.

In the present invention, each edge of the bottom surface of the roughing pump unit is supported by the vibration blocking unit to prevent vibration from the floor being transferred thereto, and the vibration blocking unit includes: a spike attached to the bottom surface of the roughing pump unit to support the roughing pump unit, and having a horned shape which is gradually sharper toward the floor; and a shoe seated on the floor and having an insertion groove formed on the upper surface for accommodating the peak of the spike to fix only the planar position of the spike.

According to the present invention, the RF sputtering apparatus for controlling an atomic layer of a thin film forms a power cable and a network with a single crystal copper wire to remove a noise of the power source by increasing stability of the power supplied to the sputtering apparatus, and increases the homogeneity of a plasma to remove electrical noise when RF power is applied to a target material.

According to the present invention, the RF sputtering apparatus for controlling an atomic layer of a thin film uses the single crystal metal as the target material, so the separated particles of the target deposited on the substrate are homogeneous on the entire surface.

According to the present invention, the RF sputtering apparatus for controlling an atomic layer of a thin film separates a sputtering main body and a roughing pump and supports both of the sputtering main body and the roughing pump with a vibration blocking unit, thereby removing physical vibration from a chamber of the sputtering main body.

As described above, the RF sputtering apparatus uniformly separates the target particles, and removes electrical noise and physical vibration to control the crystal structure of the metal thin film deposited on the substrate in an atomic layer unit, thereby manufacturing a high-quality metal thin film epitaxially grown by the single crystal having a predetermined directionality.

The effects of the present invention are not limited to the above-mentioned effects and further effects not described above will be clearly understood by those skilled in the art.

BRIEF DESCRIPTION OF THE DRAWINGS

FIG. 3 is a diagram showing changes in quality of thin films when components are added step by step in the RF sputtering apparatus for controlling an atomic layer of a thin film according to an embodiment of the present invention.

DETAILED DESCRIPTION

Figure 1:
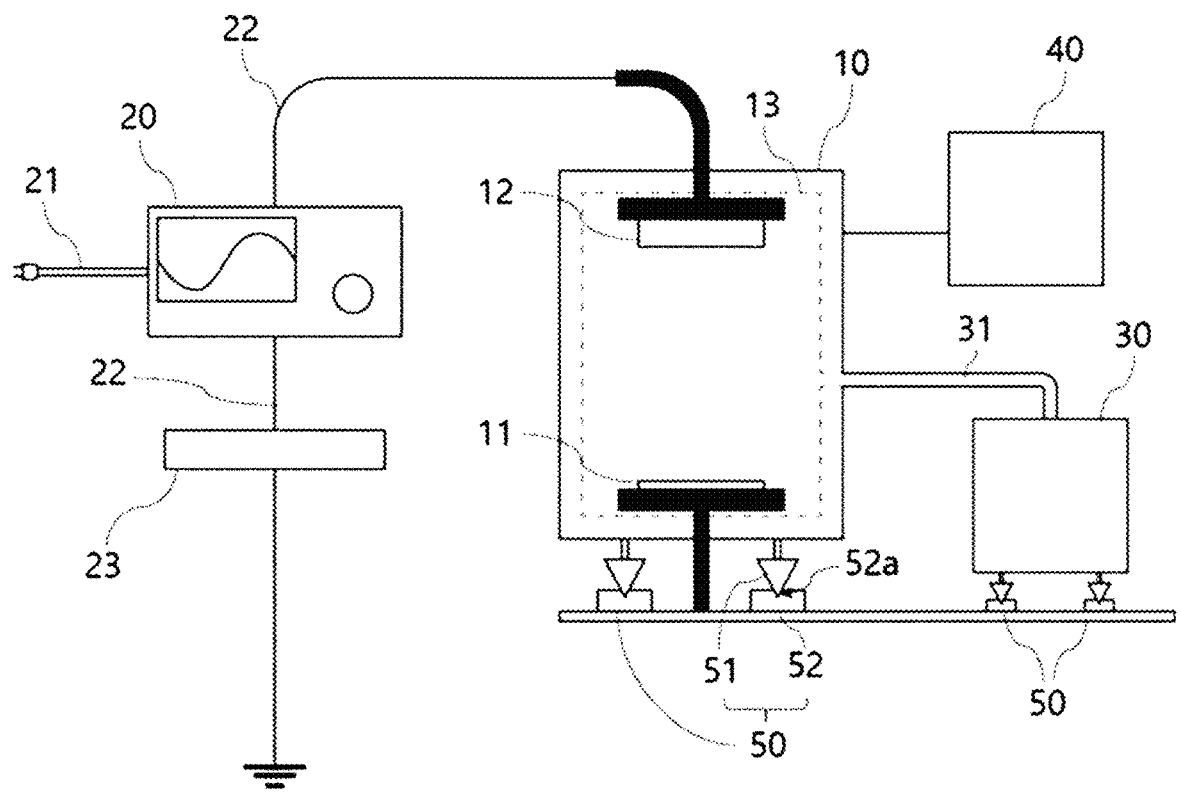
FIG. 1 is a schematic diagram illustrating a configuration of a RF sputtering apparatus for controlling an atomic layer of a thin film according to an embodiment of the present invention.

The terms including descriptive or technical terms which are used herein should be construed as having meanings that are obvious to one of ordinary skill in the art. However, the terms may have different meanings according to an intention of one of ordinary skill in the art, precedent cases, or the appearance of new technologies. Also, some terms may be arbitrarily selected by the applicant, and in this case, the meaning of the selected terms will be described in detail in the detailed description of the invention. Thus, the terms used herein have to be defined based on the meaning of the terms together with the description throughout the specification.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

Hereinafter, embodiments of the present invention will be described with reference to the accompanying drawings. However, the embodiments of the present invention described may be modified in various forms, and the scope of the present invention is not limited by the embodiments described below. The shape and size of the elements illustrated in the drawings may be exaggerated for clarity. In addition, the name of the present invention may be abbreviated as 'RF sputtering apparatus' or 'sputtering apparatus' throughout the specification.

FIG. 1 is a schematic diagram illustrating a configuration of a RF sputtering apparatus for controlling an atomic layer of a thin film according to an embodiment of the present invention. The present invention relates to an RF sputtering apparatus capable of manufacturing a high-quality metal thin film by controlling a crystal structure of a metal thin film in atomic layer units. As illustrated in FIG. 1, the RF sputtering apparatus according to an embodiment of the present invention includes a sputtering main body 10, a power supply unit 20, a roughing pump unit 30, and a gas supply unit 40.

The sputtering main body 10 is a space in which a sputtering process for depositing a metal thin film on a substrate 11 is performed, and includes a substrate 11, a target 12, and a chamber 13. The substrate 11 is an anode portion for the sputtering process, and may be typically configured in the form of a sapphire disc. The target 12 is positioned at a cathode portion facing the substrate 11. The target 12 is formed of a metal material of a thin film to be deposited on the substrate 11. The substrate 11 and the target 12 are positioned inside the chamber 13, and particles coming off the target 12 by a subsequent sputtering process are separated and deposited on the substrate 11, so a metal thin film is manufactured.

The power supply unit 20 is configured to apply RF power, which is a high frequency power, to the target 12 of the sputtering main body 10 for the sputtering process, and is connected to the target 12 through a network 22.

Meanwhile, for the sputtering process, the chamber 13 needs to form a vacuum state. The roughing pump 30 is configured to inhale fluid inside the chamber 13 to form vacuum inside the chamber 13 of the sputtering main body 10, and may be a rotary pump generally used. In addition, the gas supply unit 40 for supplying reaction gas for the sputtering process into the chamber 13 of the vacuum state is connected to the chamber 13 of the sputtering main body 10, the reaction gas supplied by the gas supply unit 40 may be argon (Ar) gas. The deposition particles are uniformly separated from the target 12 on the entire surface of the target 12 as the purity of the argon gas is higher.

As described above, when RF power is applied to the target 12 in the chamber 13 in which the reaction gas is supplied in the vacuum state through the power supply unit 20, the reaction gas is ionized by glow discharge to generate plasma discharge between the substrate 11 and the target 12, and positive ions present in a discharge area strike the surface of the target 12 by electrical power, so that the deposition particles coming off the surface of the target 12 are deposited on the substrate 11 facing the target 12, thereby manufacturing a metal thin film.

Meanwhile, according to the present invention, the power cable 21 for supplying power to the power supply unit 20 is formed with a single crystal copper wire, so that noise and signal distortion are not mixed to a signal transmitted to the power cable 21, and stability of the RF power applied to the target 12 is increased. Accordingly, the deposition particles can be homogenously separated from the entire surface of the target 12, thereby improving the quality of the metal thin film deposited on the substrate 11. Specifically, the single crystal copper wire and the single crystal terminal constituting the power cable 21 may be only physically connected to each other, and in this case, it can remove distortion of a signal generated from lead better compared to when the two parts are bonded by soldering or the like, so electrical noise may be removed from the RF power applied to the target 12 to homogenously separate the deposition particles from the entire surface of the target 12. On the other hand, the single crystal copper wire constituting the power cable 21 of the present invention may be processed into a wire rod by press-processing the single crystal copper grown by a Czochralski method or a Bridgman method using a mold having a wire cut or a pattern, or may be formed into a wire rod by drawing-processing the single crystal copper.

In addition, the homogeneity of the deposition particles coming off the target 12 is connected to the crystallinity of the target 12 in that the deposition particles are separated from the target 12. Therefore, in the present invention, the target 12 included in the sputtering main body 10 may be formed of a single crystal metal, and in particular, may be formed by cutting a single crystal metal of a cylindrical shape grown by the Czochralski method or the Bridgman method among singe crystal metal manufacturing methods, and the cut single crystal metal may be formed in a disk shape or a rectangular shape. As described above, in a case in which the target 12 is formed of the single crystal metal, the metal particles are uniformly formed on the entire surface of the target 12 with a predetermined directionality, and the deposition particles separated from the target 12 may also be homogenized. The type of the single crystal metal forming the target 12 may be determined according to the type of the metal thin film to be deposited on the substrate 11, and may be copper, silver, or metal of a single element.

In addition, the network 22 for transferring the RF power of the power supply unit 20 to the target 12 of the sputtering main body 10 may also be formed with a single crystal copper wire. Since the network 22 for transferring RF power is also formed with the single crystal copper wire, it may remove electrical noise from the RF power applied to the target 12 and improve stability of power, thereby improving homogeneity of the plasma discharge formed between the substrate 11 and the target. Accordingly, the deposition particles can be homogenously separated from the entire surface of the target 12.

In addition, an outdoor grounding part 23 formed for grounding of the power supply unit 20 may be formed with a single crystal copper bulk obtained by cutting the cylindrical single crystal copper grown by the Czochralski method or the Bridgman method, for example, the single crystal copper bulk may be in the form of a disc shape. The single crystal copper constituting the outdoor grounding part 23 may be manufactured together with the target 12 in a case in which the metal type of the target 12 is copper. As described above, in a case in which the outdoor ground unit 23 is formed with the single crystal copper bulk, since the stability of the RF power may be increased, the deposition particles may be homogenously separated.

As described above, in a case in which the deposition particles may be homogenously separated through the homogeneity of the target 12 or removal of electrical noise, it can not only improve the quality of the metal thin film but also prevent physical vibration from being applied in the process of depositing the deposition particles separated from the target 12 on the substrate 11, thereby getting the metal thin film to epitaxially grow up to have a predetermined directionality. Hereinafter, the above will be described.

Each edge of the bottom surface of the sputtering main body may be supported by the vibration blocking unit 50 to prevent vibration from the floor being transferred thereto. The vibration blocking unit 50 has a dynamically irreversible structure that does not transfer vibration of the floor to the sputtering main body 10 but discharges vibration generated from the sputtering main body 10 to the outside (floor) to offset. Specifically, the vibration blocking unit 50 includes a spike 51 and a shoe 52. The spike 51 is attached to the bottom surface of the sputtering main body 10 to support the sputtering main body 10, and has a horned shape which is gradually sharper toward the floor. The shoe 52 is seated on the floor to receive the spike 51 on the upper surface thereof. The shoe 52 has an insertion groove 52a formed on the upper surface for accommodating the peak of the spike 51. The spike 51 is accommodated in the insertion groove 52a of the shoe 52 to fix the planar position of the spike 51. As described above, the vibration blocking unit 50 including the spike 51 and the shoe 52 shakes only the shoe 52 but does not apply power to the spike 51, so that vibration is not transferred to the sputtering main body 10 supported by the spike 51. As a result, since the sputtering main body 10 is not affected by the vibration of the floor, no physical external force is transferred in the process of depositing the deposition particles separated from the target 12 on the substrate 11, and thus the deposition particles are homogenously deposited on the substrate 11 to improve the quality of the metal thin film. Meanwhile, the spike 51 may have various shapes such as a cone, a triangular pyramid, a quadrangular pyramid, etc. if the spike 51 is in a horned shape.

In order to further block physical vibration to the sputtering main body 10, the present invention may physically separate the sputtering main body 10 and the roughing pump unit 30. For example, the roughing pump unit 30 may be a rotary pump. The rotary pump generates a large amount of vibration by the operation of the pump while sucking the fluid to make the chamber 13 of the sputtering main body 10 in a vacuum state. In a case in which the sputtering main body 10 and the roughing pump unit 30 are physically configured together, the vibration generated during the operation of the roughing pump unit 30 is transferred to the sputtering main body 10 as it is, so the deposition particles deposited on the substrate 11 are not uniformly formed. Accordingly, in order to physically separate the roughing pump unit 30 from the sputtering main body 10, to connect to the chamber 13 via a connection hose 31 made of a rubber material, and to block even the vibration of the connection hose from being transferred to the sputtering main body 10, the center of the connection hose 31 may be fixed on the wall surface connected to the floor.

Meanwhile, in a case in which the roughing pump unit 30 is physically separated from the sputtering main body 10, it is necessary to block the roughing pump unit 30 from vibration. So, like the sputtering main body 10, in order to prevent the vibration from the floor from being transferred to the roughing pump unit 30, each corner of the bottom surface may be supported by the vibration blocking unit 50. The specific configuration of the vibration blocking unit 50 is the same as described above.

Figure 2:
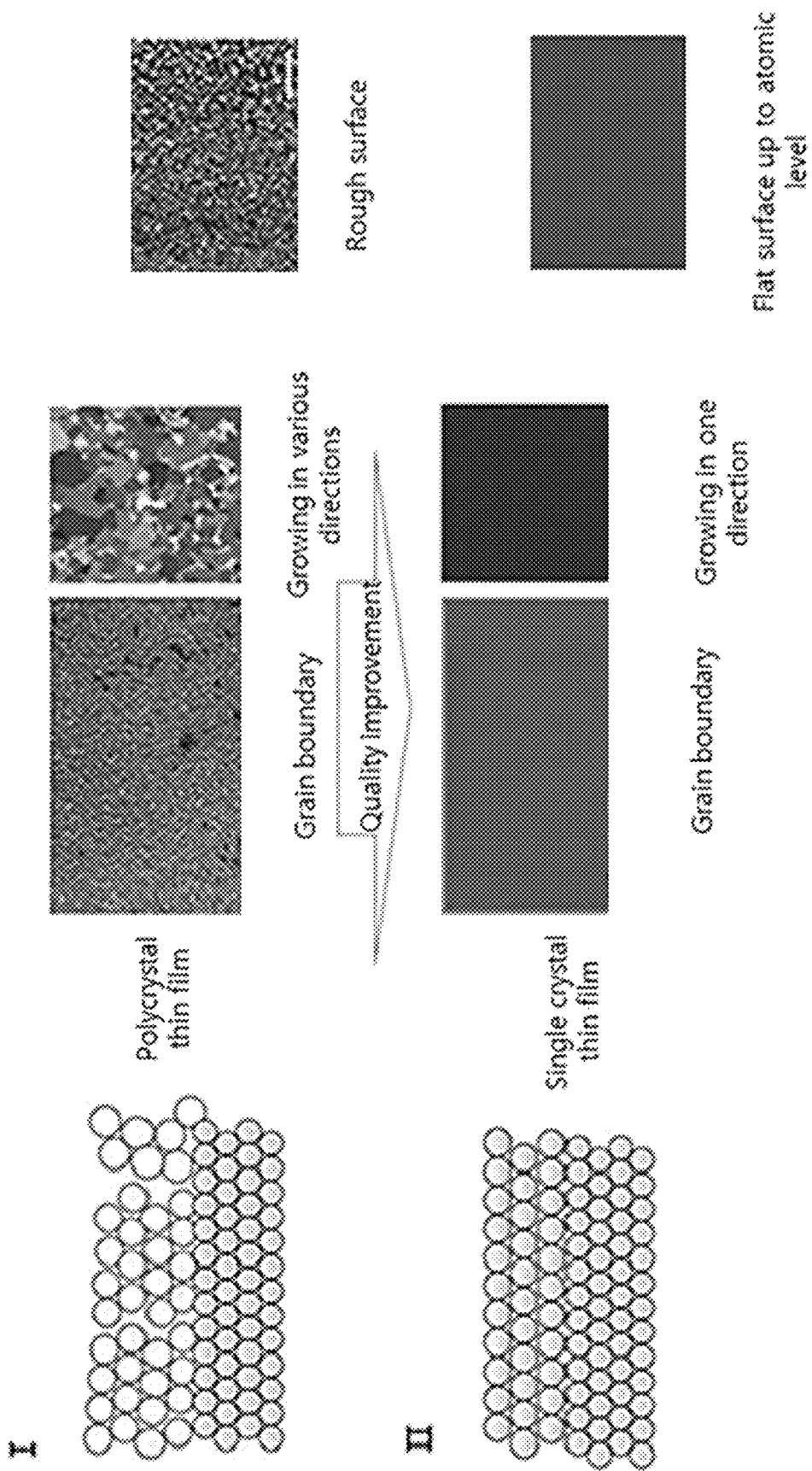
FIG. 2 is a view illustrating a comparison result to compare qualities between a thin film manufactured by the RF sputtering apparatus according to the present invention and a thin film manufactured by a conventional sputtering method.

FIG. 2 is a view illustrating a comparison result to compare qualities between a thin film manufactured by the RF sputtering apparatus according to the present invention and a thin film manufactured by a conventional sputtering method. FIG. 3 is a diagram showing changes in quality of thin films when components are added step by step in the RF sputtering apparatus for controlling an atomic layer of a thin film according to an embodiment of the present invention. With reference to FIGS. 2 and 3, the quality of the thin film manufactured according to the present invention will be described to describe superiority of the present invention.

Referring to FIG. 2, in a case (I) in which a thin film is manufactured by a general RF sputtering method, the quality of the thin film is not good since crystals grow in various directions. However, in a case (II) in which electrical noise and physical vibration are removed through the present invention, there is almost no grain boundary between crystals, and the crystals grow only in one direction, so as to have a flat surface up to an atomic level.

Referring to FIG. 3, the quality improvement of the thin film according to gradual addition of the components is described. First, in a case (1) in which a thin film is manufactured by the conventional RF sputtering apparatus, a root mean square (RMS) value for surface roughness is 45 nm or less. However, in a case (2) in which the target is replaced with a single crystal metal, the RMS roughness is reduced to 10 nm or less. Additionally, in a case (3) in which the outdoor grounding part is replaced with a single crystal copper bulk and the power cable and the network are formed with a single crystal copper wire, the RMS roughness is improved to a level of 0.2 to 0.5 nm with 85% probability. In addition, in a case (4) in which the sputtering main body is supported by the vibration blocking unit, the RMS roughness has a level of 0.2 to 0.4 nm with 90% probability. In a case in which the roughing pump unit is physically separated from the sputtering main body and is supported by the vibration blocking unit, RMS roughness becomes 0.3 nm or less with 98% probability.

As described above, while the present invention has been particularly shown and described with reference to the example embodiments thereof, it will be understood by those of ordinary skill in the art that the present invention may be realized in other specific forms without altering the technical spirit or essential features of the invention. In this regard, it should be understood that the above embodiments of the present invention are all exemplified and the present invention is not limited to the above embodiments.

EXPLANATION OF REFERENCE NUMBERS

10: Sputtering main body
11: Substrate
12: Target
13: Chamber
20: Power supply unit
21: Power cable
22: Network
23: Outdoor grounding part
30: Roughing pump unit
31: Connection hose
40: Gas supply unit
50: Vibration blocking unit
51: Spike
52: Shoe
52*a*: Insertion groove

The invention claimed is:

1. An RF sputtering apparatus for controlling an atomic layer of a thin film, comprising:
   a sputtering main body including a substrate, a target facing the substrate, and a chamber for performing a sputtering process to deposit the target on the substrate;
   a power supply unit connected to the target of the sputtering main body via a network to apply RF power;
   a roughing pump unit for forming vacuum inside the chamber of the sputtering main body; and
   a gas supply unit for supplying reaction gas to the inside of the chamber,
   wherein a power cable for supplying a power source to the power supply unit is formed with a single crystal copper wire,
   wherein the network for transferring the RF power of the power supply unit to the sputtering main body is formed with a single crystal copper wire, and
   wherein an outdoor grounding part grounded on the power supply unit is formed with a single crystal copper bulk.

2. The RF sputtering apparatus according to claim 1, wherein the target of the sputtering main body is formed into a single crystal target by cutting a single crystal metal of a cylindrical shape grown by the Czochralski method or the Bridgman method.

3. The RF sputtering apparatus according to claim 1, wherein the single crystal copper bulk is obtained by cutting the cylindrical single crystal copper grown by the Czochralski method or the Bridgman method.

4. The RF sputtering apparatus according to claim 1, wherein each edge of bottom surfaces of the sputtering main body and the roughing pump unit is supported by a vibration blocking unit to prevent vibration from a floor being transferred thereto, and
   wherein the vibration blocking unit comprises:
   a spike attached to the bottom surfaces to support the sputtering main body and the roughing pump unit, and having a horned shape which is gradually sharper toward the floor; and
   a shoe seated on the floor and having an insertion groove formed on an upper surface for accommodating a peak of the spike to fix only a planar position of the spike.

5. The RF sputtering apparatus according to claim 4, wherein the roughing pump unit is physically separated from the sputtering main body, and is connected to the chamber via a connection hose made of a rubber material, and
   wherein a center of the connection hose is fixed on a wall surface connected to the floor.

* * * * *